(12) United States Patent
Pratt et al.

(10) Patent No.: US 8,084,854 B2
(45) Date of Patent: Dec. 27, 2011

(54) PASS-THROUGH 3D INTERCONNECT FOR MICROELECTRONIC DIES AND ASSOCIATED SYSTEMS AND METHODS

(75) Inventors: David S. Pratt, Meridian, ID (US); Kyle K. Kirby, Eagle, ID (US); Dewali Ray, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 683 days.

(21) Appl. No.: 11/966,824

(22) Filed: Dec. 28, 2007

(65) Prior Publication Data

US 2009/0166846 A1 Jul. 2, 2009

(51) Int. Cl.
*H01L 23/04* (2006.01)
(52) U.S. Cl. .. 257/698; 257/621; 257/777; 257/E23.011
(58) Field of Classification Search .................. 257/686, 257/777, E25.017, 621, 774, E23.011, E23.067, 257/E23.145, E23.174
See application file for complete search history.

(56) References Cited

U.S. PATENT DOCUMENTS

| | | | |
|---|---|---|---|
| 5,145,099 A | 9/1992 | Wood et al. | |
| 5,233,448 A | 8/1993 | Wu | |
| 5,654,221 A | 8/1997 | Cronin et al. | |
| 5,776,824 A | 7/1998 | Farnworth et al. | |
| 5,821,532 A | 10/1998 | Beaman et al. | |
| 5,851,845 A | 12/1998 | Wood et al. | |
| 6,008,070 A | 12/1999 | Farnworth | |
| 6,097,087 A | 8/2000 | Farnworth et al. | |
| 6,103,547 A | 8/2000 | Corisis et al. | |
| 6,114,240 A | 9/2000 | Akram et al. | |
| 6,124,634 A | 9/2000 | Akram et al. | |
| 6,133,622 A | 10/2000 | Corisis et al. | |
| 6,159,764 A | 12/2000 | Kinsman et al. | |
| 6,184,465 B1 | 2/2001 | Corisis | |

(Continued)

FOREIGN PATENT DOCUMENTS

| KR | 2002-0022122 | 3/2002 |
|---|---|---|
| WO | WO-2005/036940 | 4/2005 |
| WO | WO-2006/053036 | 5/2006 |

OTHER PUBLICATIONS

Cheung, T.S.D. et al., "On-Chip Interconnect for mm-Wave Applications Using an All-Copper Technology and Wavelength Reduction," 2003 IEEE International Solid-State Circuits Conference.
Lee, T.K. et al., "A Novel Joint-in-Via Flip-Chip Chip-Scale Package," IEEE Transactions on Advanced Packaging, vol. 29, No. 1, pp. 186-194, Feb. 2006.
Chou, Bill et al., "Ultra Via Substrate for Advanced BGA Applications," Pan Pacific Symposium, Jan. 25, 2000, <http://www.smta.org/files/PanPac00-ChouBill.pdf>.

(Continued)

*Primary Examiner* — Minh-Loan T Tran
*Assistant Examiner* — Leslie Pilar Cruz
(74) *Attorney, Agent, or Firm* — Perkins Coie LLP

(57) ABSTRACT

Pass-through 3D interconnects and microelectronic dies and systems of stacked dies that include such interconnects are disclosed herein. In one embodiment, a system of stacked dies includes a first microelectronic die having a substrate, a metal substrate pad, and a first integrated circuit electrically coupled to the substrate pad. A pass-through 3D interconnect extends between front and back sides of the substrate, including through the substrate pad. The pass-through interconnect is electrically isolated from the substrate pad and electrically coupled to a second integrated circuit of a second microelectronic die attached to the back side of the substrate. In another embodiment, the first integrated circuit is a first memory device and the second integrated circuit is a second memory device, and the system uses the pass-through interconnect as part of an independent communication path to the second memory device.

13 Claims, 11 Drawing Sheets

U.S. PATENT DOCUMENTS

| | | |
|---|---|---|
| 6,222,270 B1 | 4/2001 | Lee |
| 6,228,687 B1 | 5/2001 | Akram et al. |
| 6,229,202 B1 | 5/2001 | Corisis |
| 6,246,108 B1 | 6/2001 | Corisis et al. |
| 6,271,580 B1 | 8/2001 | Corisis |
| 6,291,894 B1 | 9/2001 | Farnworth et al. |
| 6,294,837 B1 | 9/2001 | Akram et al. |
| 6,326,697 B1 | 12/2001 | Farnworth |
| 6,576,531 B2 | 6/2003 | Peng et al. |
| 6,582,992 B2 | 6/2003 | Poo et al. |
| 6,620,731 B1 | 9/2003 | Farnworth et al. |
| 6,774,486 B2 | 8/2004 | Kinsman |
| 6,797,616 B2 | 9/2004 | Kinsman |
| 6,809,025 B2 | 10/2004 | Sandhu et al. |
| 6,828,175 B2 | 12/2004 | Wood et al. |
| 6,858,891 B2 | 2/2005 | Farnworth et al. |
| 6,885,107 B2 | 4/2005 | Kinsman |
| 6,903,442 B2 | 6/2005 | Wood et al. |
| 6,903,443 B2 | 6/2005 | Farnworth et al. |
| 6,913,952 B2 | 7/2005 | Moxham et al. |
| 6,946,325 B2 | 9/2005 | Yean et al. |
| 7,023,090 B2 | 4/2006 | Huang et al. |
| 7,037,836 B2 | 5/2006 | Lee |
| 7,083,425 B2 | 8/2006 | Chong et al. |
| 7,084,073 B2 | 8/2006 | Lee et al. |
| 7,091,124 B2 | 8/2006 | Rigg et al. |
| 7,109,068 B2 | 9/2006 | Akram et al. |
| 7,164,565 B2 | 1/2007 | Takeda |
| 7,183,653 B2 | 2/2007 | Myers et al. |
| 7,190,061 B2 | 3/2007 | Lee et al. |
| 7,199,050 B2 | 4/2007 | Hiatt |
| 7,217,596 B2 | 5/2007 | Cobbley et al. |
| 7,217,888 B2 | 5/2007 | Sunohara et al. |
| 7,232,754 B2 | 6/2007 | Kirby et al. |
| 7,262,134 B2 | 8/2007 | Kirby et al. |
| 7,265,052 B2 | 9/2007 | Sinha |
| 7,271,482 B2 | 9/2007 | Kirby |
| 7,300,857 B2 | 11/2007 | Akram et al. |
| 2001/0000013 A1 | 3/2001 | Lin |
| 2002/0130390 A1 | 9/2002 | Ker et al. |
| 2003/0199119 A1 | 10/2003 | Lin |
| 2003/0216023 A1 | 11/2003 | Wark et al. |
| 2004/0041261 A1 | 3/2004 | Kinsman |
| 2004/0043607 A1 | 3/2004 | Farnworth et al. |
| 2004/0178491 A1 | 9/2004 | Akram et al. |
| 2004/0198033 A1 | 10/2004 | Lee et al. |
| 2005/0046002 A1* | 3/2005 | Lee et al. ............ 257/678 |
| 2005/0069782 A1 | 3/2005 | Elenius et al. |
| 2005/0104228 A1 | 5/2005 | Rigg et al. |
| 2005/0110095 A1 | 5/2005 | Shih et al. |
| 2005/0110889 A1 | 5/2005 | Tuttle et al. |
| 2005/0127478 A1 | 6/2005 | Hiatt et al. |
| 2005/0150683 A1 | 7/2005 | Farnworth et al. |
| 2005/0164500 A1 | 7/2005 | Lindgren |
| 2005/0184219 A1 | 8/2005 | Kirby |
| 2005/0208766 A1 | 9/2005 | Kirby et al. |
| 2005/0227382 A1 | 10/2005 | Hui |
| 2005/0231626 A1 | 10/2005 | Tuttle et al. |
| 2005/0236708 A1 | 10/2005 | Farnworth et al. |
| 2005/0247894 A1 | 11/2005 | Watkins et al. |
| 2005/0253213 A1 | 11/2005 | Jiang et al. |
| 2005/0254133 A1 | 11/2005 | Akram et al. |
| 2005/0275048 A1 | 12/2005 | Farnworth et al. |
| 2005/0275049 A1 | 12/2005 | Kirby et al. |
| 2005/0275051 A1 | 12/2005 | Farnworth et al. |
| 2005/0275750 A1 | 12/2005 | Akram et al. |
| 2005/0285154 A1 | 12/2005 | Akram et al. |
| 2006/0011809 A1 | 1/2006 | Farnworth et al. |
| 2006/0014313 A1 | 1/2006 | Hall et al. |
| 2006/0023107 A1 | 2/2006 | Bolken et al. |
| 2006/0024856 A1 | 2/2006 | Derderian et al. |
| 2006/0035402 A1 | 2/2006 | Street et al. |
| 2006/0035415 A1 | 2/2006 | Wood et al. |
| 2006/0038183 A1 | 2/2006 | Oliver |
| 2006/0040421 A1 | 2/2006 | Farnworth et al. |
| 2006/0040428 A1 | 2/2006 | Johnson |
| 2006/0042952 A1 | 3/2006 | Oliver et al. |
| 2006/0043262 A1 | 3/2006 | Akram |
| 2006/0043509 A1 | 3/2006 | Watkins et al. |
| 2006/0043512 A1 | 3/2006 | Oliver et al. |
| 2006/0043535 A1* | 3/2006 | Hiatt ............ 257/621 |
| 2006/0043569 A1 | 3/2006 | Benson et al. |
| 2006/0044433 A1 | 3/2006 | Akram |
| 2006/0046332 A1 | 3/2006 | Derderian et al. |
| 2006/0046438 A1 | 3/2006 | Kirby |
| 2006/0046468 A1 | 3/2006 | Akram et al. |
| 2006/0046471 A1 | 3/2006 | Kirby et al. |
| 2006/0148250 A1 | 7/2006 | Kirby |
| 2006/0151880 A1 | 7/2006 | Tang et al. |
| 2006/0154153 A1 | 7/2006 | Chiang et al. |
| 2006/0177959 A1 | 8/2006 | Boettiger et al. |
| 2006/0177999 A1 | 8/2006 | Hembree et al. |
| 2006/0180941 A1 | 8/2006 | Kirby et al. |
| 2006/0186097 A1 | 8/2006 | Watkins et al. |
| 2006/0186492 A1 | 8/2006 | Boettiger et al. |
| 2006/0191882 A1 | 8/2006 | Watkins et al. |
| 2006/0199363 A1 | 9/2006 | Kirby et al. |
| 2006/0208360 A1 | 9/2006 | Yiu et al. |
| 2006/0216862 A1 | 9/2006 | Rigg et al. |
| 2006/0264041 A1 | 11/2006 | Rigg et al. |
| 2006/0270108 A1 | 11/2006 | Farnworth et al. |
| 2006/0289968 A1 | 12/2006 | Sulfridge |
| 2006/0290001 A1 | 12/2006 | Sulfridge |
| 2006/0292877 A1 | 12/2006 | Lake |
| 2007/0004079 A1 | 1/2007 | Geefay et al. |
| 2007/0032061 A1 | 2/2007 | Farnworth et al. |
| 2007/0045388 A1 | 3/2007 | Farnworth et al. |
| 2007/0045515 A1 | 3/2007 | Farnworth et al. |
| 2007/0045632 A1 | 3/2007 | Oliver et al. |
| 2007/0045779 A1 | 3/2007 | Hiatt |
| 2007/0045812 A1 | 3/2007 | Heng |
| 2007/0045826 A1 | 3/2007 | Lee et al. |
| 2007/0045834 A1 | 3/2007 | Chong et al. |
| 2007/0048896 A1 | 3/2007 | Andry et al. |
| 2007/0048994 A1 | 3/2007 | Tuttle |
| 2007/0049016 A1 | 3/2007 | Hiatt et al. |
| 2007/0057028 A1 | 3/2007 | Lake et al. |
| 2007/0077753 A1 | 4/2007 | Iwatake et al. |
| 2007/0126091 A1 | 6/2007 | Wood et al. |
| 2007/0152342 A1 | 7/2007 | Tsao et al. |
| 2007/0158853 A1 | 7/2007 | Sinha |
| 2007/0166991 A1 | 7/2007 | Sinha |
| 2007/0170574 A1 | 7/2007 | Lauxtermann et al. |
| 2007/0178694 A1 | 8/2007 | Hiatt |
| 2007/0190803 A1 | 8/2007 | Singh et al. |
| 2007/0197013 A1 | 8/2007 | Trezza |
| 2007/0202617 A1 | 8/2007 | Hembree |
| 2007/0222050 A1 | 9/2007 | Lee et al. |
| 2007/0222054 A1 | 9/2007 | Hembree |
| 2007/0262424 A1 | 11/2007 | Hiatt |
| 2008/0050904 A1 | 2/2008 | Lake |
| 2008/0050911 A1 | 2/2008 | Borthakur |
| 2008/0054444 A1 | 3/2008 | Tuttle |
| 2008/0057620 A1 | 3/2008 | Pratt |
| 2008/0081398 A1 | 4/2008 | Lee et al. |
| 2008/0150089 A1* | 6/2008 | Kwon et al. ............ 257/621 |
| 2009/0007934 A1 | 1/2009 | Hutto |
| 2009/0014859 A1 | 1/2009 | Jeung et al. |
| 2009/0057912 A1 | 3/2009 | Kheng |
| 2009/0146312 A1 | 6/2009 | Sulfridge |
| 2009/0283898 A1 | 11/2009 | Janzen et al. |
| 2009/0315154 A1 | 12/2009 | Kirby et al. |
| 2009/0321947 A1 | 12/2009 | Pratt |
| 2010/0096759 A1 | 4/2010 | Kirby et al. |

OTHER PUBLICATIONS

Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567.

Trigas, C., "System-In-Package or System-On-Chip?," EE Times, Sep. 19, 2003, <http://www.eetimes.com/story/OEG20030919S0049>.

* cited by examiner

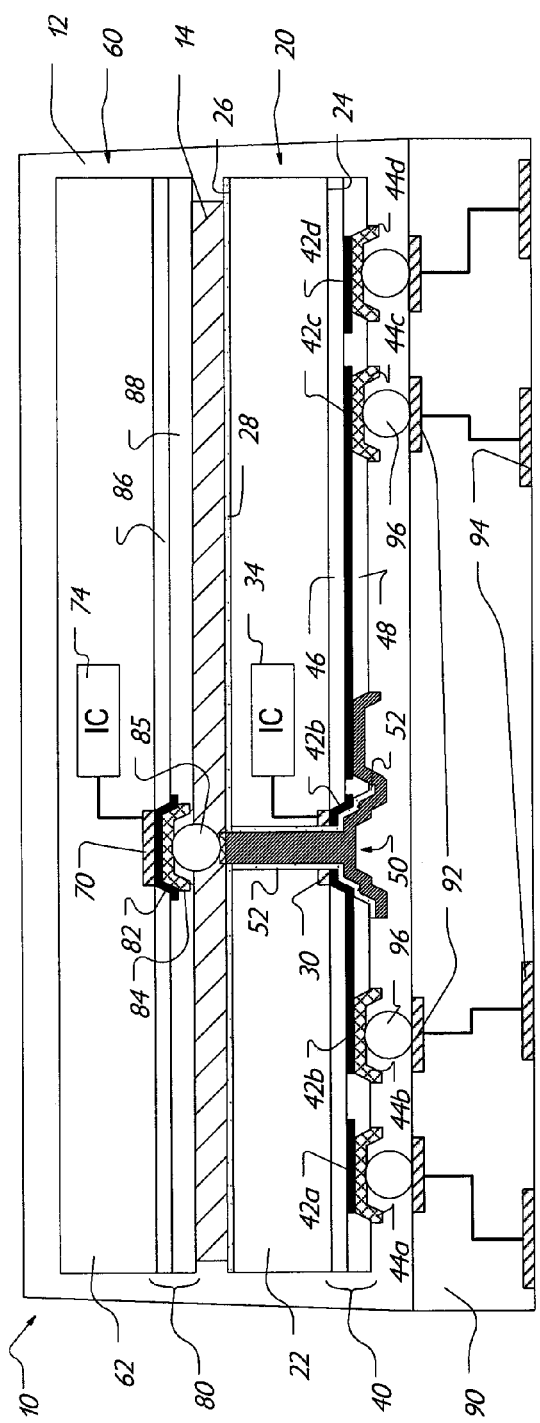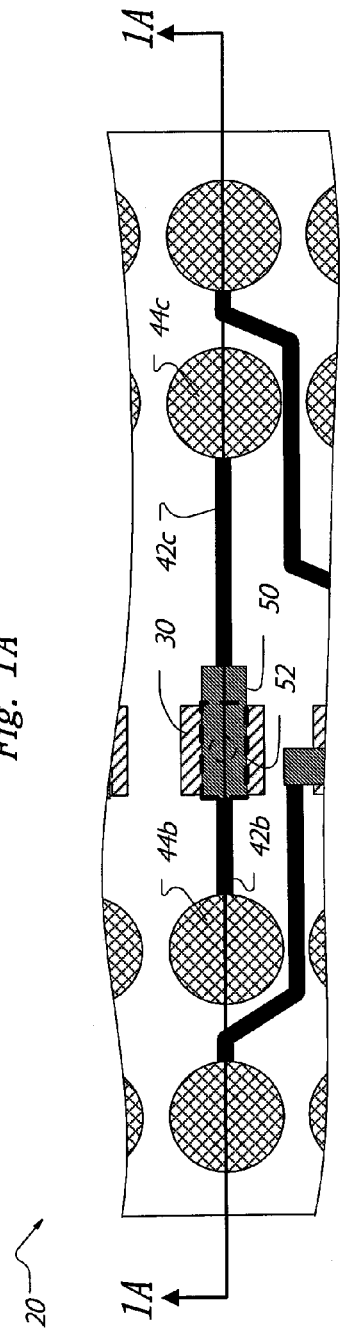

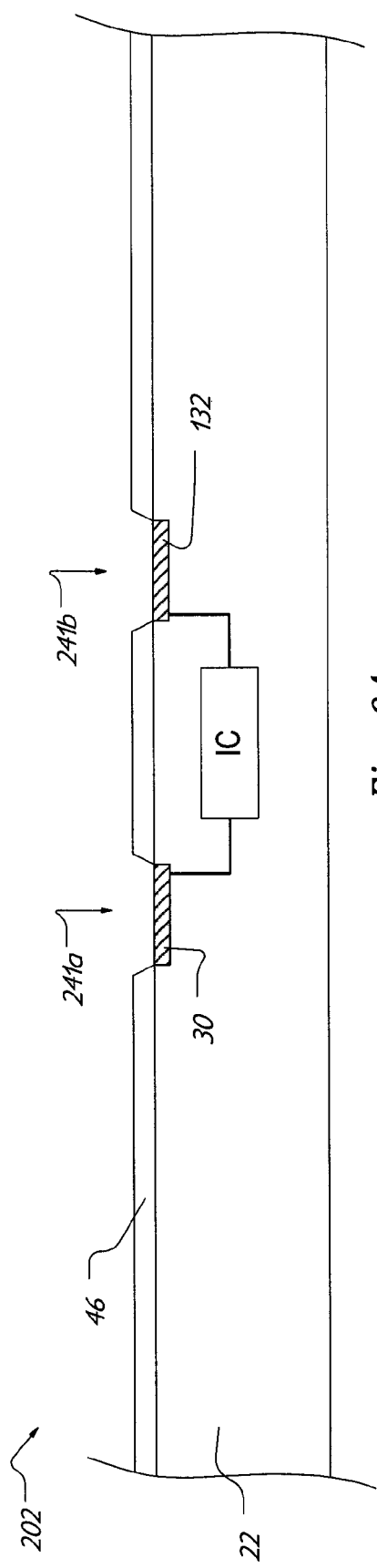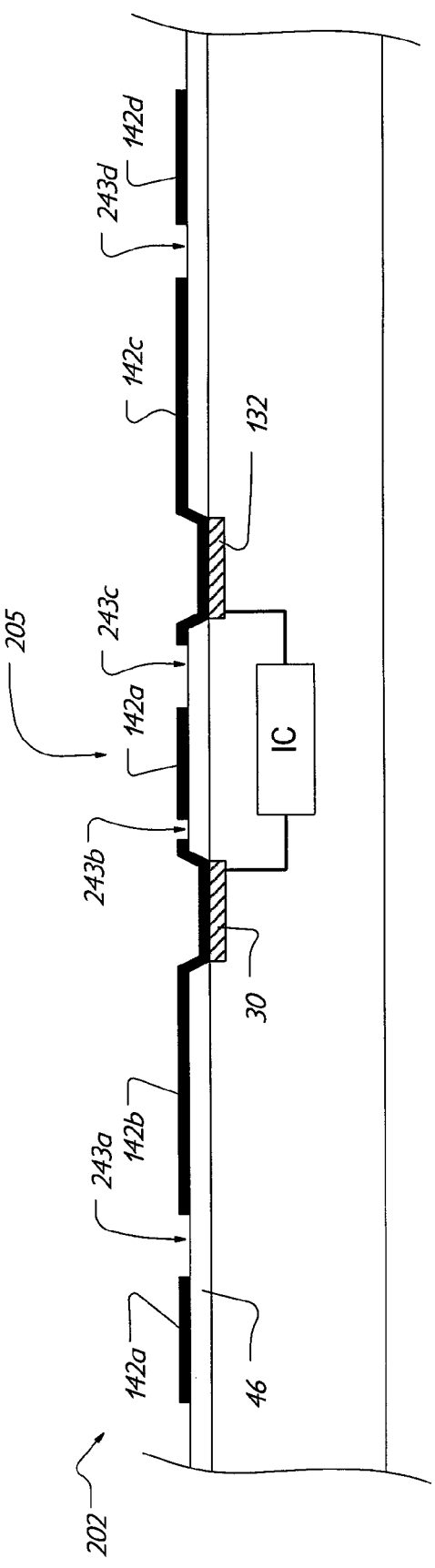

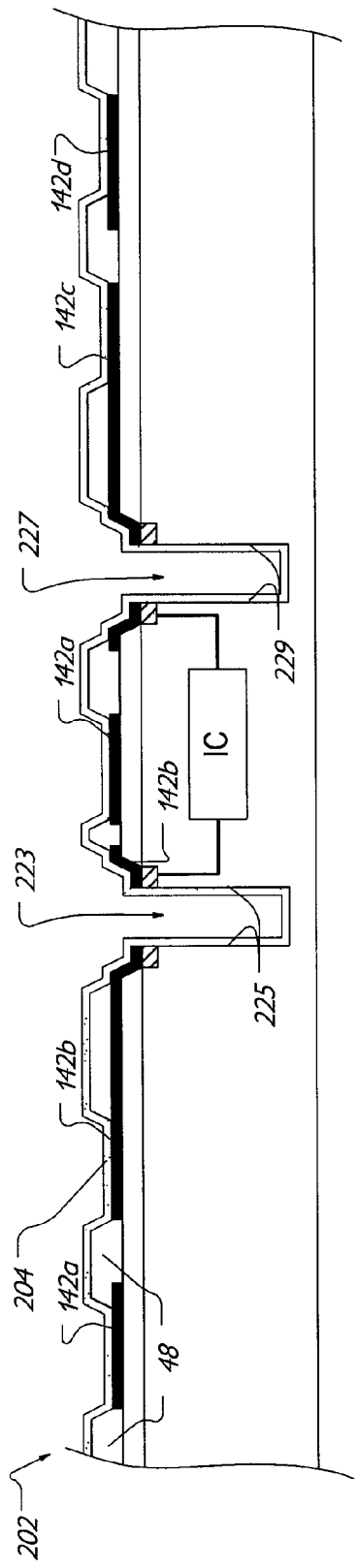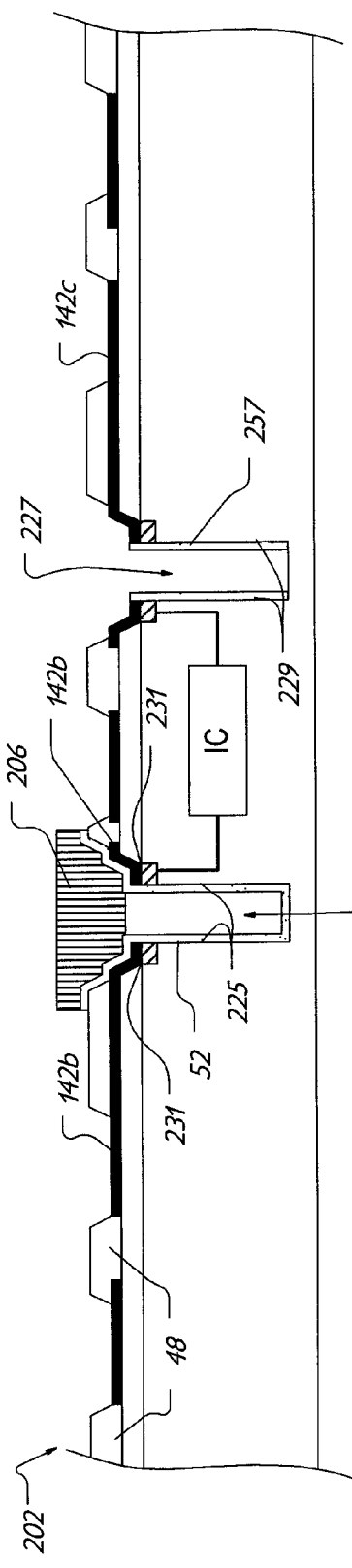

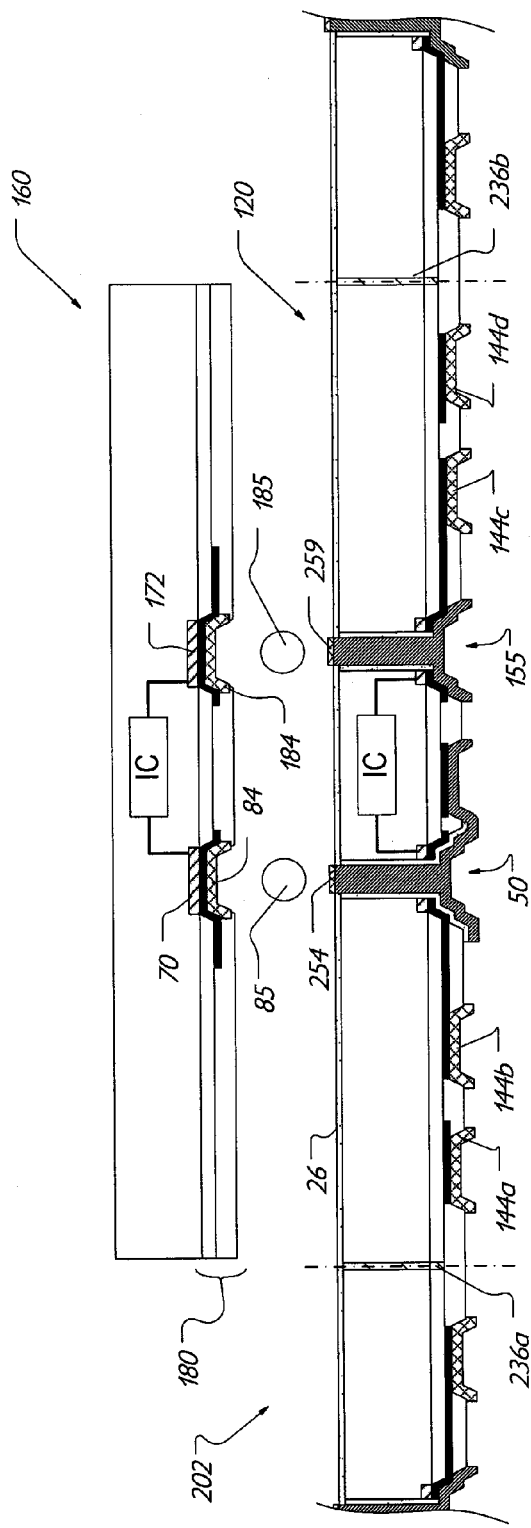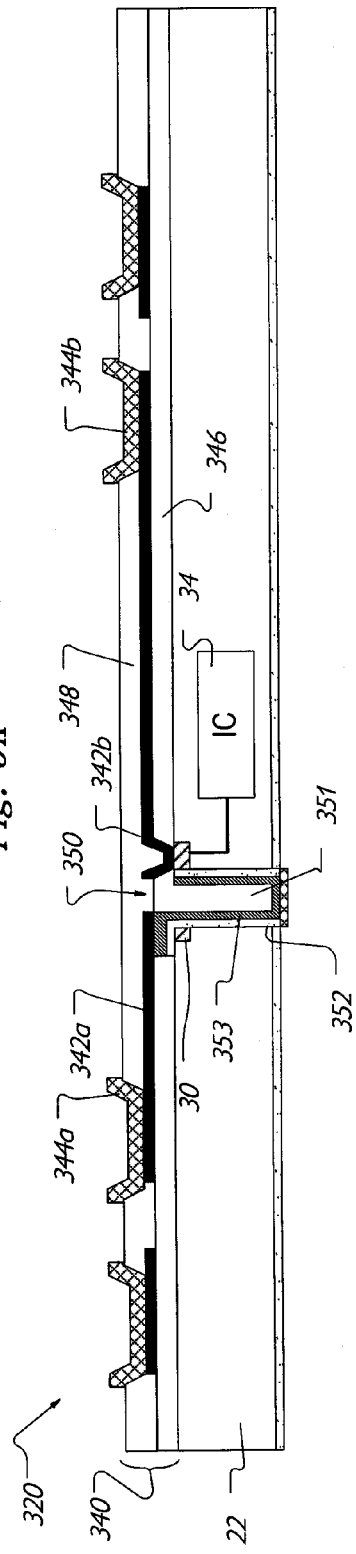
Fig. 3K
Fig. 4

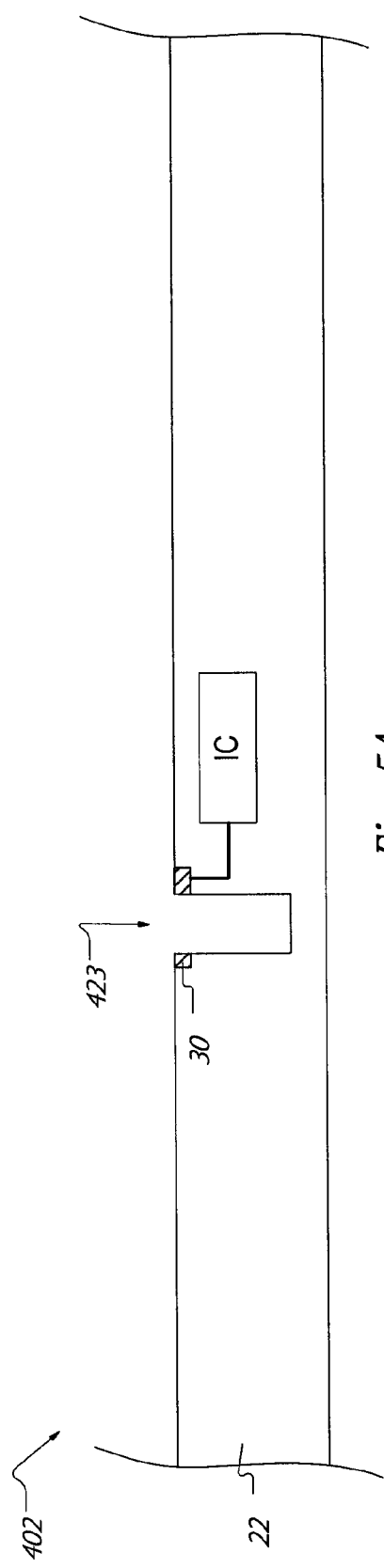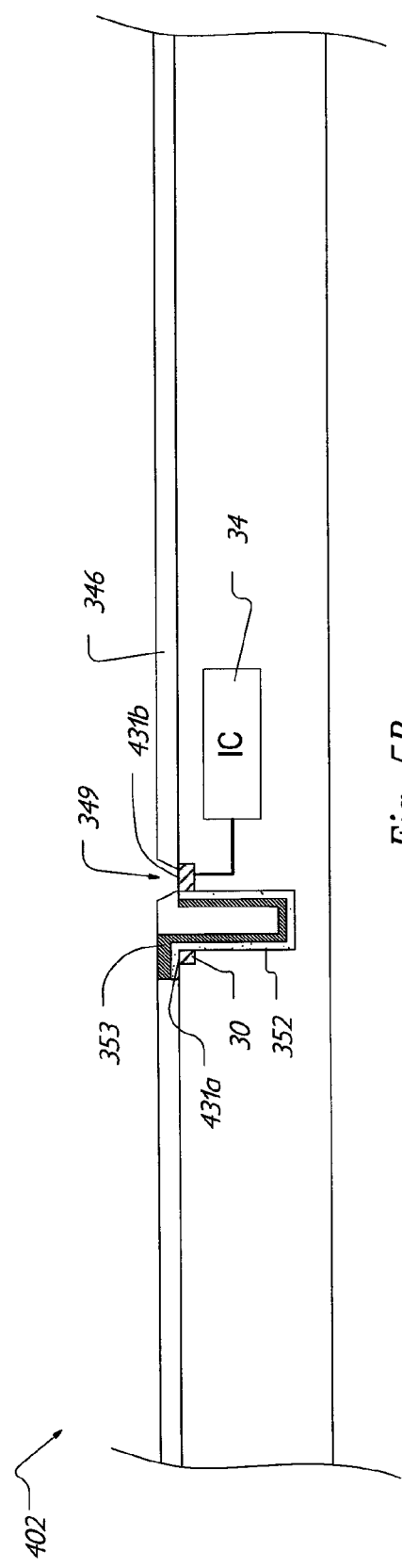

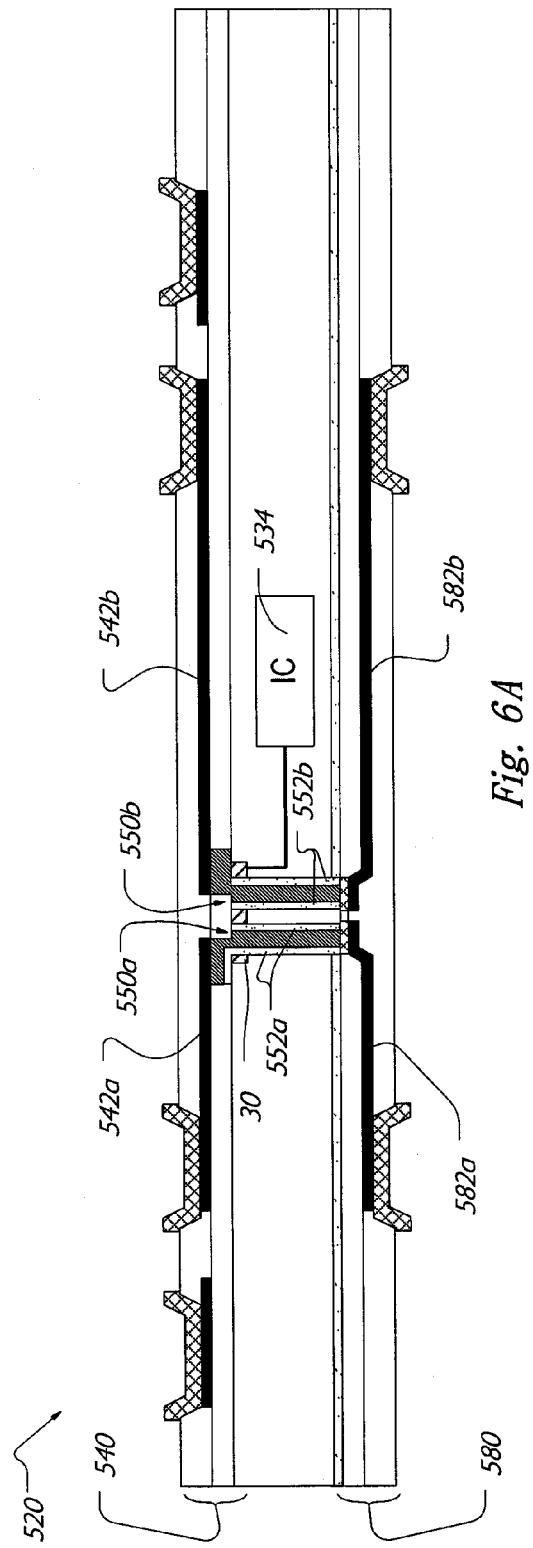
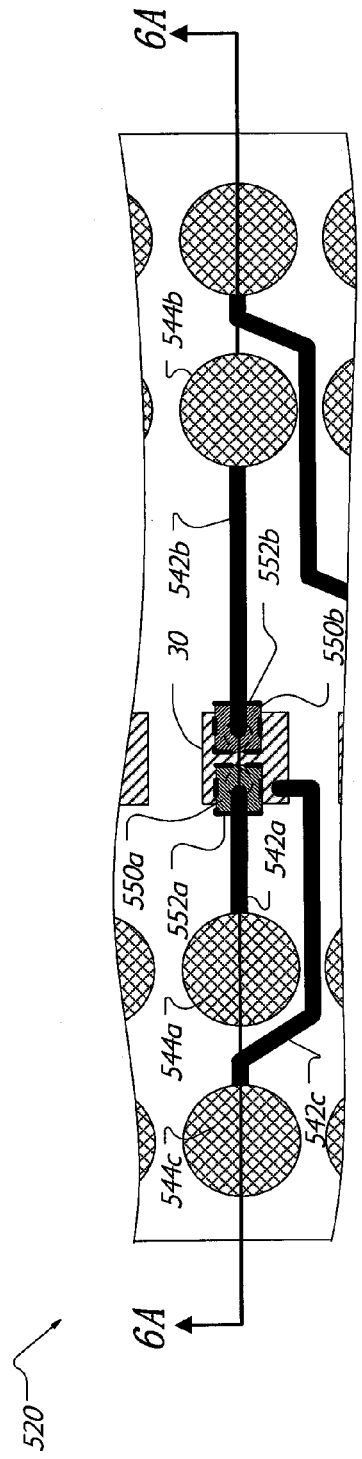

US 8,084,854 B2

PASS-THROUGH 3D INTERCONNECT FOR MICROELECTRONIC DIES AND ASSOCIATED SYSTEMS AND METHODS

TECHNICAL FIELD

The present disclosure is directed generally to microelectronic die packages, and more particularly to stacked microelectronic dies having through-die or through-layer interconnects.

BACKGROUND

Packaged microelectronic assemblies, such as memory chips and microprocessor chips, typically include a microelectronic die mounted to a substrate and encased in a plastic protective covering. The die includes functional features, such as memory cells, processor circuits, and interconnecting circuitry. The die also typically includes bond pads electrically coupled to the functional features. The bond pads are electrically connected to pins or other types of terminals that extend outside the protective covering for connecting the die to busses, circuits, or other microelectronic assemblies. In one conventional arrangement, the die is mounted (face down) to a supporting substrate (e.g., a printed circuit board), and the die bond pads are electrically coupled to corresponding bond pads of the substrate with metal bumps (e.g., solder balls or other suitable connections). After encapsulation, additional metal bumps can electrically connect the substrate to one or more external devices. Accordingly, the substrate supports the die and provides an electrical link between the die and the external devices.

Die manufacturers have come under increasing pressure to reduce the volume occupied by the dies and yet increase the capacity of the resulting encapsulated assemblies. To meet these demands, die manufacturers often stack multiple dies on top of each other to increase the capacity or performance of the device within the limited surface area on the circuit board or other element to which the dies are mounted.

BRIEF DESCRIPTION OF THE DRAWINGS

FIG. 1A is a cross-sectional side view of a system of stacked microelectronic dies including a pass-through 3D interconnect configured in accordance with an embodiment of the disclosure.

FIG. 1B is a top-plan view of one of the stacked dies of FIG. 1A.

FIGS. 3A-3K illustrate stages of forming the system of FIGS. 2A and 2B in accordance with several embodiments of the disclosure.

FIG. 4 is a cross-sectional side view of a microelectronic die including a pass-through 3D interconnect configured in accordance with another embodiment of the disclosure.

FIGS. 5A and 5B illustrate stages of forming the pass-through interconnect of FIG. 4.

FIGS. 6A and 6B are cross-sectional side and top-plan views of a microelectronic die including multiple 3D interconnects configured in accordance with another embodiment of the disclosure.

DETAILED DESCRIPTION

Figure 2A:
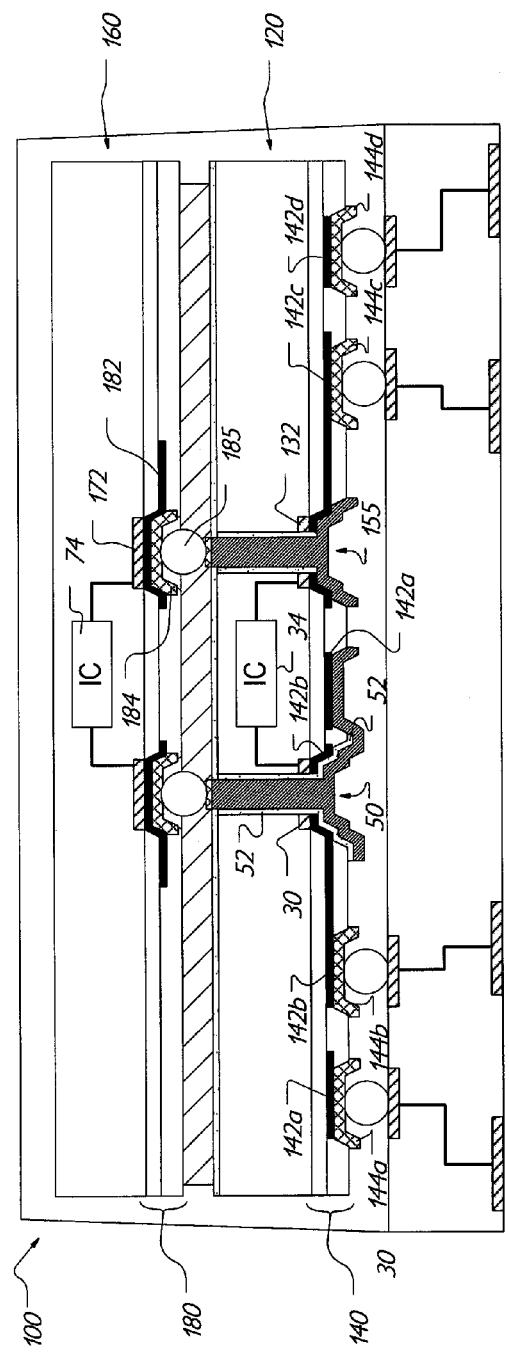
FIG. 2A is a cross-sectional side view of another system of stacked microelectronic dies including an embodiment of a pass-through 3D interconnect and a conventional 3D interconnect.

Various embodiments of pass-through 3D interconnects (or through-die or through-silicon vias) and microelectronic dies and/or systems of dies that include such interconnects are described below. The term "interconnect" may encompass various types of conductive structures that extend at least partially through a substrate of a microelectronic die and electrically couple together conductive contacts located at opposing ends of the interconnect. The term "substrate" may encompass any of a variety of conductive and/or non conductive layers (e.g., metallic, semi conductive, and/or dielectric materials) that are situated upon and/or within one another. Such substrates can include any of a myriad of electrical devices (e.g., transistors, resistors, capacitors, etc.) or systems of such devices (e.g., an integrated circuit, a memory, a processor, etc.) formed in the conductive and/or non conductive layers of an individual substrate. Other embodiments of pass-through interconnects, substrates, and microelectronic dies and/or systems of dies that include such interconnects and substrates, in addition to or in lieu of the embodiments described in this section, may have several additional features or may not include many of the features shown and described below with reference to FIGS. 1A-8.

FIG. 1A is a cross-sectional side view of an embodiment of a system 10 of stacked microelectronic dies 20 and 60. The first die 20 includes a substrate 22 having a front side 24 and a back side 26, a redistribution layer 40 attached to the substrate front side 24, and an embodiment of a pass-through 3D interconnect 50 extending through the substrate 22. The substrate 22 includes a passivation layer 28 at the back side 26, a metal substrate or contact pad 30 at the front side 24, and a first integrated or semiconductor circuit 34 electrically coupled to the substrate pad 30. The redistribution layer 40 includes metal traces 42a-d, metal outer lead bond (OLB) pads 44a-d coupled, respectively, to individual traces 42a-d, and insulating layers 46 and 48 electrically isolating individual traces 42a-d and OLB pads 44a-d from one another and from the substrate 22. The pass-through interconnect 50 is connected to the trace 42c and is at least partially lined with a dielectric layer 52, which electrically isolates the pass-through interconnect 50 from the substrate 22, the substrate pad 30, and the individual trace 42b. Similar to the first die 20, the second die 60 includes a substrate 62 and a redistribution layer 80 attached to the second die substrate 62. In many embodiments, the second die substrate 62 includes a substrate pad 70 and a second integrated circuit 74 electrically coupled to the substrate pad 70. The second die redistribution layer 80 can include, accordingly, a metal trace 82 coupled to the substrate pad 70, a metal OLB pad 84 coupled to the trace 82, and insulation layers 86 and 88 electrically isolating the trace 82 and OLB pad 84 from the second die substrate 62. In the embodiment of FIG. 1A, the OLB pad 84 is electrically coupled to the pass-through interconnect 50 via a bump bond 85, which in turn electrically couples the second integrated circuit 74 to the redistribution layer 40 of the first die 20.

Embodiments of the system 10 can also include a dielectric casing 12 encapsulating the first and second dies 20 and 60, an adhesive or epoxy layer 14 positioned between the first and second dies, and an interposer substrate 90. The interposer substrate 90 (e.g., a printed circuit board), for example, can carry the first and second dies 20 and 60 and can include die bond pads 92 and package bond pads 94 electrically coupled to the die bond pads 92 through the substrate 90. In several embodiments, individual bump bonds 96 are aligned with and attached to individual OLB pads 44a-d of the first die 20 and individual die bond pads 94 of the interposer substrate 90. Accordingly, individual package bond pads 94 can provide an electrical coupling to the first integrated circuit 34 of the first die 20 and/or the second integrated circuit 74 of the second die 60.

FIG. 1B is a partial top-plan view of the first die 20 showing the traces 42b and 42c routed to a common surface area associated with the substrate pad 30. The trace 42b connects the OLB pad 44b to the substrate pad 30, and the trace 42c connects the OLB pad 44c to the pass-through interconnect 50. The dielectric layer 52 (drawn in phantom) electrically isolates the pass-through interconnect 50 from the substrate pad 30 and trace 42b such that the pass-through interconnect 50 is not in electrical communication with the first integrated circuit 34 of the first die 20 (FIG. 1A). Thus, the OLB pad 44c is in electrical communication with the second integrated circuit 74 of the second die 60 (FIG. 1A) via the pass-through interconnect 50, but the OLB pad 44c is not in electrical communication with the first integrated circuit 34. Similarly, the OLB pad 44b is in electrical communication with the first integrated circuit 34 via the substrate pad 30 but is not in electrical communication with the second integrated circuit 74.

In general, the substrate pads of a die are favorable locations for pass-through 3D interconnects because they are easy to locate and because they are generally not positioned above an underlying integrated circuit. In fact, most design rules typically forbid positioning a substrate pad above an integrated circuit. For example, integrated circuits include thin and fragile oxide layers that are sensitive to physical stresses induced at the surface of a die. Placing substrate pads above the integrated circuit could result in damage to these layers during die manufacturing, such as by electrical testing equipment that probes the substrate pads. Accordingly, in the example of FIGS. 1A and 1B, a die manufacturer can form the pass-through interconnect 50 at the substrate pad 30, knowing that at this location, the pass-through interconnect 50 will not damage layers of the first integrated circuit 34. In addition, the die manufacturer can use the pass-through interconnect 50 to electrically couple an OLB pad or other type of electrical contact to the second integrated circuit 74 without making electrical contact with the substrate pad 30 and the first integrated circuit 34 in communication with the substrate pad 30.

In contrast to the pass-through interconnect 50, conventional 3D interconnects cannot be formed through a substrate pad without also making electrical contact with the integrated circuit that is connected to the substrate pad. For example, conventional 3D interconnects typically include a portion of plated metal that is directly deposited on a substrate pad or on a metal trace that is coupled to the substrate pad. To electrically isolate a conventional 3D interconnect from the substrate pad, one conventional method includes creating a "dummy" substrate pad and forming the interconnect through the dummy pad. A dummy pad typically is not connected to an integrated circuit but is instead a metal pad that is used to identify a pass-through location within a die. However, despite providing a suitable pass-through location, dummy pads can occupy a significant amount of die surface area. As microelectronic dies become smaller and more compact, dummy pads can be a limiting design factor in stacked systems of dies. Alternatively, another method of forming conventional 3D interconnects includes identifying suitable pass-through locations that are not situated below a substrate pad (i.e., those not having an integrated circuit). However, forming 3D interconnects at such locations can be difficult. The microscopic features of an integrated circuit are not readily visible at the die surface, and a conventional 3D interconnect might make physical contact with these features if not aligned properly.

Embodiments of the pass-through interconnect 50, however, can be formed in a substrate pad that is electrically coupled to an integrated circuit without also making electrical contact with the integrated circuit. For example, a portion of a metal trace or other type of electrical contact can be electrically "jumped" with the pass-through interconnect 50 (described further with reference to FIG. 3B). In several embodiments, the pass-through interconnect 50 conserves die surface area by eliminating the need for dummy pads or other types of substrate vacancies absent an integrated circuit. In addition, embodiments of pass-through 3D interconnects can also be situated at locations other than a substrate pad. For example, a pass-through interconnect can be formed through other types of conductive layers at the surface of and/or within a microelectronic substrate. Further, embodiments of the pass-through interconnect 50 can also be employed in combination with conventional 3D interconnects, such as those that are intentionally connected to a substrate pad in electrical communication with an integrated circuit.

Figure 2B:
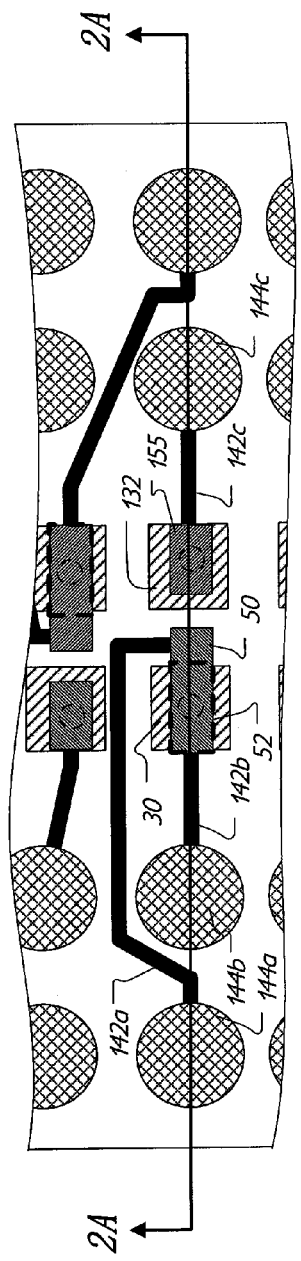
FIG. 2B is a top-plan view of one of the stacked dies of FIG. 2A.

FIGS. 2A and 2B illustrate such an embodiment, showing a stacked system 100, employing the pass-through interconnect 50 in combination with a conventional 3D interconnect 155. In general, the stacked system 100 may be similar to the stacked system 10, in which like elements refer to like elements throughout. FIG. 2A is a cross-sectional side view of the system 100 showing a first die 120 having a redistribution layer 140 and a second die 160 attached to the first die 120 and having a redistribution layer 180. The first die 120 includes the pass-through interconnect 50 formed through the substrate pad 30 and the conventional interconnect 155 formed through a substrate pad 132. The first die redistribution layer 140 includes metal traces 142a-d and metal OLB pads 144a-d coupled, respectively, to individual traces 142a-d. The pass-through interconnect 50 is connected to the trace 142a and is electrically isolated from the trace 142b and the substrate pad 30 by the dielectric layer 52. The conventional interconnect 155 is connected to the trace 142c, which is in turn connected to the first integrated circuit 34 via the substrate pad 132. The second die 160 includes a substrate pad 172 coupled to the second integrated circuit 74, and the second die redistribution layer 180 includes a metal OLB pad 184 and corresponding metal trace 182 coupling the OLB pad 184 to the second die substrate pad 172. A bump bond 185, can in turn, couple the second die substrate pad 172 to the conventional interconnect 155.

FIG. 2B is a partial top-plan view of the first die 120 showing the trace 142a coupled to the pass-through interconnect 50, the trace 142b coupled to the substrate pad 30, and the trace 142c coupled to both the substrate pad 132 and the conventional interconnect 155. The dielectric layer 52 (drawn in phantom) inhibits electrical communication between the OLB pad 144a and first integrated circuit 34 and between the OLB pad 144b and the second integrated circuit 74. Accordingly, the OLB pad 144a is in electrical communication with the second integrated circuit 74 (FIG. 2A), the OLB pad 144b is in electrical communication with the first integrated circuit 34 (FIG. 2A), and the OLB pad 144c is in electrical communication with both the first and second integrated circuits 34 and 74.

Figure 3C:
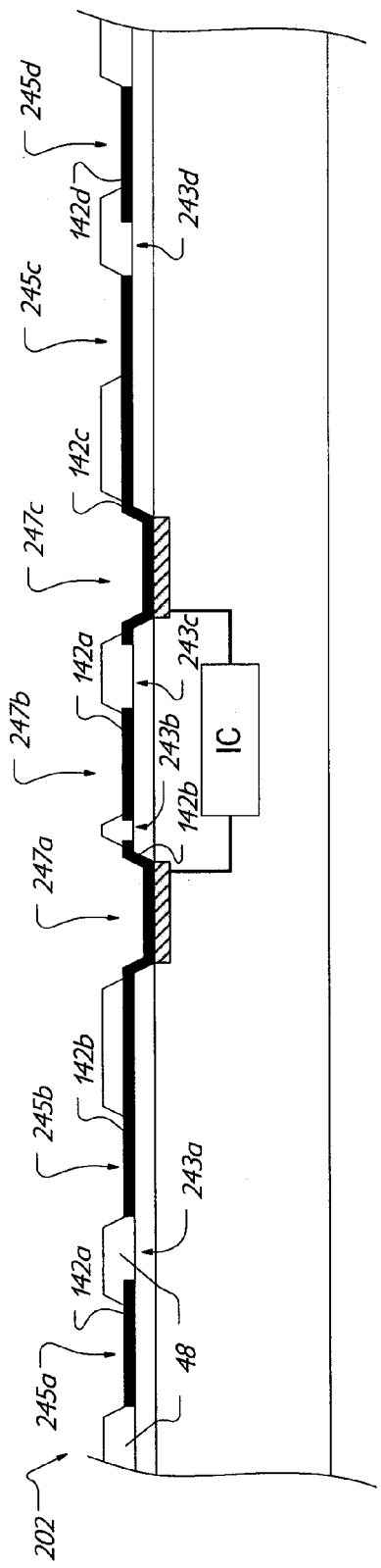

FIGS. 3A-K illustrate stages of forming the system 100, including the pass-through interconnect 50 and the conventional interconnect 155, in accordance with several embodiments of the disclosure. FIG. 3A is a cross-sectional side view of a microelectronic workpiece 202 (e.g., a semiconductor or microelectronic wafer), including the substrate 22, the substrate pads 30 and 132, and the insulating layer 46 after it has been deposited on the substrate 22 and etched to create openings 241a and 241b. The opening 241a defines the location of the pass-through interconnect 50 (FIG. 2A) at the substrate pad 30, and the opening 241b defines the location of the interconnect 155 (FIG. 2A) at the substrate pad 132. In many embodiments, the insulating layer 46, along with the insulating layer 48 (FIG. 1A), may include a variety of non conductive polymer or oxide materials. For example, the insulating layers 46 and 48 can include polybenzoxazole (PBO) or other types of polymeric coating materials that can be spun onto the substrate 22.

FIG. 3B is a cross-sectional side view of the workpiece 202 after forming the individual traces 142a-d on top of the insulating layer 46 and the substrate pads 30 and 132. The traces 142a-d are separated from one another by individual openings 243a-d, which form locations that will be subsequently filled by the insulating layer 48 (described further with reference to FIG. 3C). The traces 142a-d can include a variety of conductive materials, such as aluminum, copper, or aluminum-copper alloys. In addition, the traces 142a-d can also include various types of liner materials, such as titanium, tantalum, titanium nitride or tantalum nitride. Also, in several embodiments, a landing pad portion 205 of the trace 142a (situated between the openings 243b and 243c) can be formed at a variety of locations at the workpiece 202, including adjacent other substrate pads or workpiece 202 features. The positioning of such a landing pad can vary on which of the traces 142a-d should be electrically jumped through the first die 120 (FIG. 1) via a pass-through 3D interconnect.

FIG. 3C is a cross-sectional side view of the workpiece 202 after depositing the insulating layer 48 on the traces 142a-d and within the openings 243a-d. The insulating layer 48 has also been patterned/etched to create individual openings 245a-d and 247a-c, exposing surface portions of the traces 142a-d. In particular, the openings 245a-d define locations of the OLB pads 144a-d (FIGS. 2A and 2B), and the openings 247a-c define plating locations at the pass-through interconnect 50 and the conventional interconnect 155 (described further with reference to FIGS. 3G and 3H).

Figure 3D:
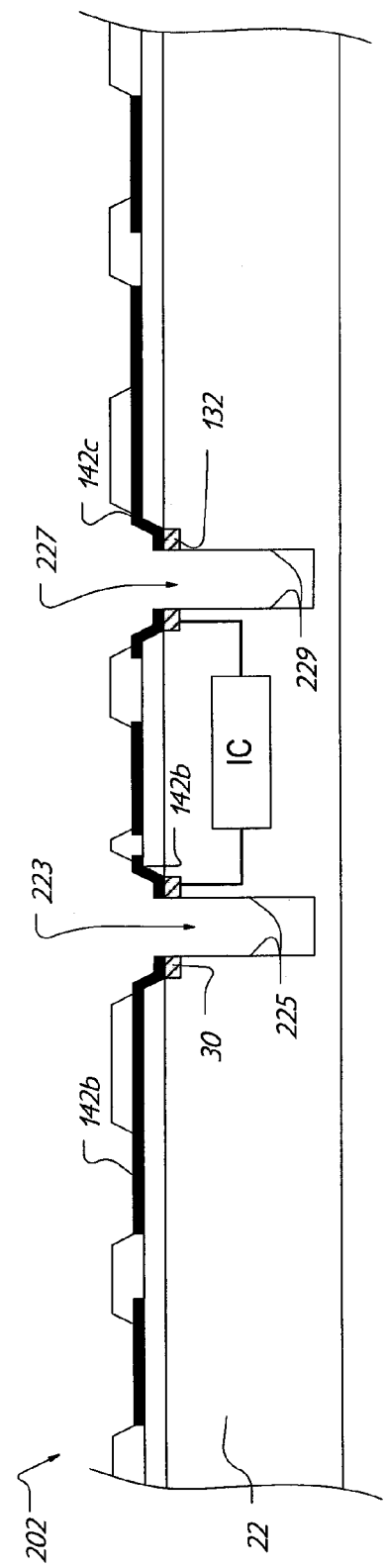

FIG. 3D is a cross-sectional side view of the workpiece 202 after the formation of first and second holes 223 and 227. The first hole 223 includes sidewalls 225, which extend through the trace 142b, the substrate pad 30, and a portion of the substrate 22. Similarly, the second hole 227 includes sidewalls 229, which extend through the trace 142c, the substrate pad 132, and a portion of the substrate 22. In many embodiments, the first and second holes 223 and 227 can be formed by single- or multi-step etching processes, employing wet/dry etching techniques and/or laser drilling/ablation methods.

FIG. 3E is a cross-sectional side view of the workpiece 202 after a dielectric layer 204 is globally deposited on the workpiece 202, lining surfaces of the insulating layer 48, the traces 142a-d, the sidewalls 225 of the first hole 223 and the sidewalls 229 of the second hole 227. In many embodiments, the dielectric layer 204 includes a non conductive material that can be deposited at low temperatures, such as those that can be deposited using chemical vapor and/or physical vapor deposition (CVD and/or PVD) processes. For example, the dielectric layer 204 can include an aluminum-oxide ($Al_2O_3$) film or other type of dielectric coating material.

FIG. 3F is a cross-sectional side view of the workpiece 202 after forming a mask 206 (e.g., a photoresist mask) and etching through the dielectric layer 204 (FIG. 3E) to form the dielectric layer 52 and a separate dielectric layer 257. The mask 206 is located above the first hole 223, covers a front-side portion of the insulating layer 48, and also covers a portion of the trace 142b located above a front-side contact surface 231 of the substrate pad 130. Accordingly, after the etch, the dielectric layer 52 is attached to the front-side surface portion of the insulating layer 48, extends above the front-side contact surface 231, and also lines the first hole sidewalls 225. The dielectric layer 52 is accordingly attached to sections of the trace 142b, the substrate pad 30, and the substrate 22. Similarly, the dielectric layer 257 lines the sidewalls 229 of the second hole 227. However, the dielectric layer 257 is not masked, and thus the dielectric layer 257 does not cover trace 142c or the insulating layer 48. In other embodiments, the dielectric layers 52 and 257 may be positioned or otherwise configured differently. For example, the dielectric layer 52 may be formed directly on top of the front-side contact surface 231 of the substrate pad 30 (described further with reference to FIG. 4).

Figure 3G:
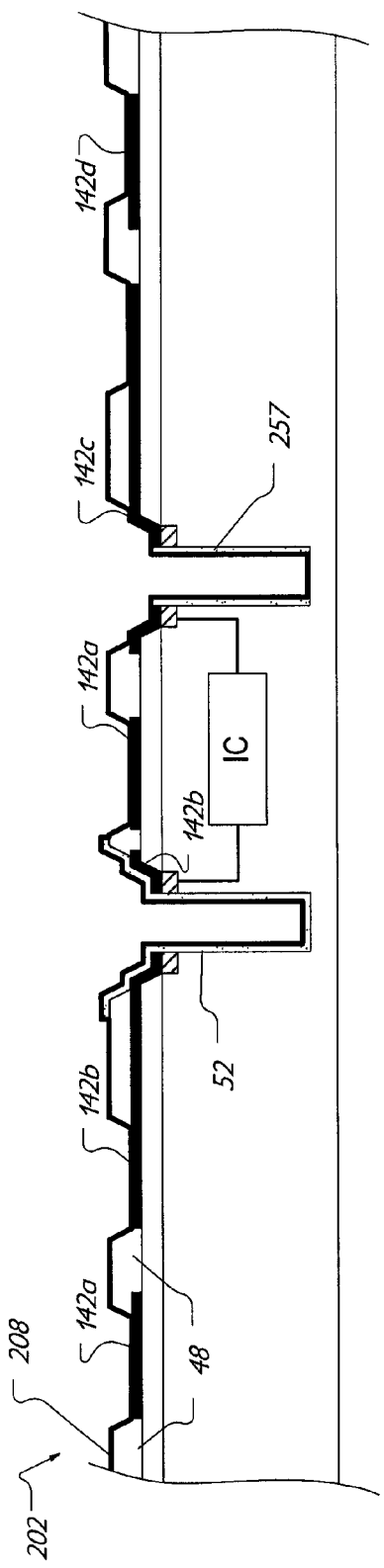
Figure 3H:
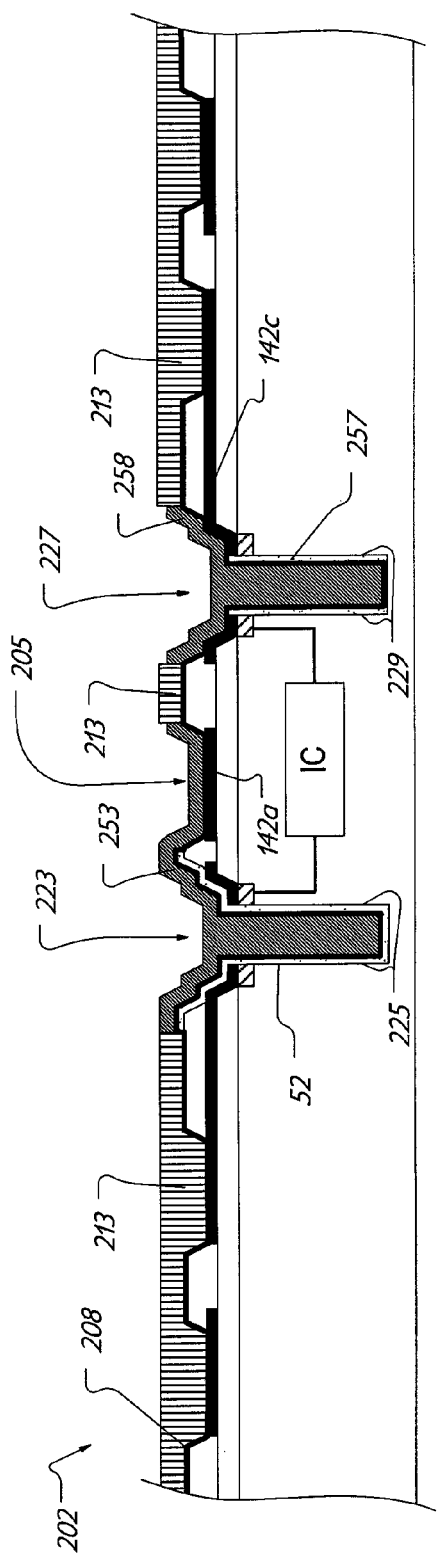

FIGS. 3G and 3H are cross-sectional side views of the workpiece 202 after forming a seed layer 208 and plating the seed layer with first and second metal layers 253 and 258. FIG. 3G shows the seed layer 208 globally deposited onto the workpiece 202, lining surfaces of the insulating layer 48, the traces 142a-d, the dielectric layer 52, and the dielectric layer 257. FIG. 3H shows a mask 213 covering portions of the seed layer 208 that remain unplated. Accordingly, the first metal layer 253 is plated onto the dielectric layer 52 and a portion of the trace 142a, and the second metal layer 258 is plated onto the dielectric layer 257 and a portion of the trace 142c. In many embodiments, the first and second metal layers 253 and 258 are formed by an electroplating process, and the metal layers 253 and 258 can include copper, gold, nickel, and/or palladium. For example, the seed layer 208 can be a conductive material, such as copper, and may receive an electrical potential for initiating plating of the metal layers 253 and 258. Also, while the first and second metal layers 253 and 258 are shown as completely filling the holes 223 and 227, in other examples, the metal layers 253 and 258 may only partially fill the holes 223 and 227. For example, the metal layers 253 and 258 can attach to the first and second hole sidewalls 225 and 229, but may include voids that extend through the centers of the first and second holes 223 and 227. Further, in other embodiments, an electroless plating process may be used to form the first and second metal layers 253 and 258.

Figure 3I:
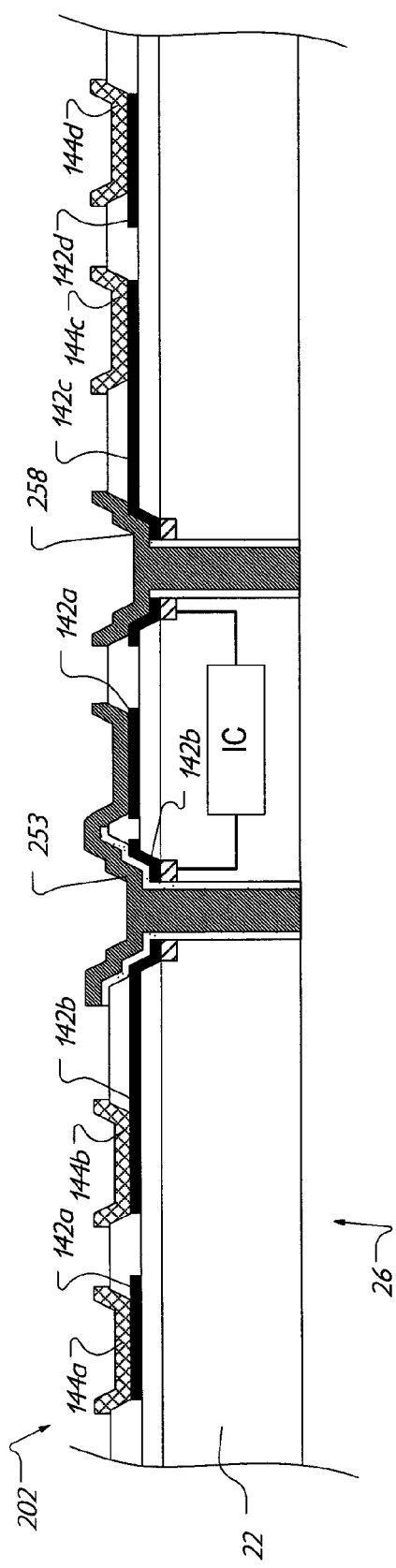
Figure 3J:
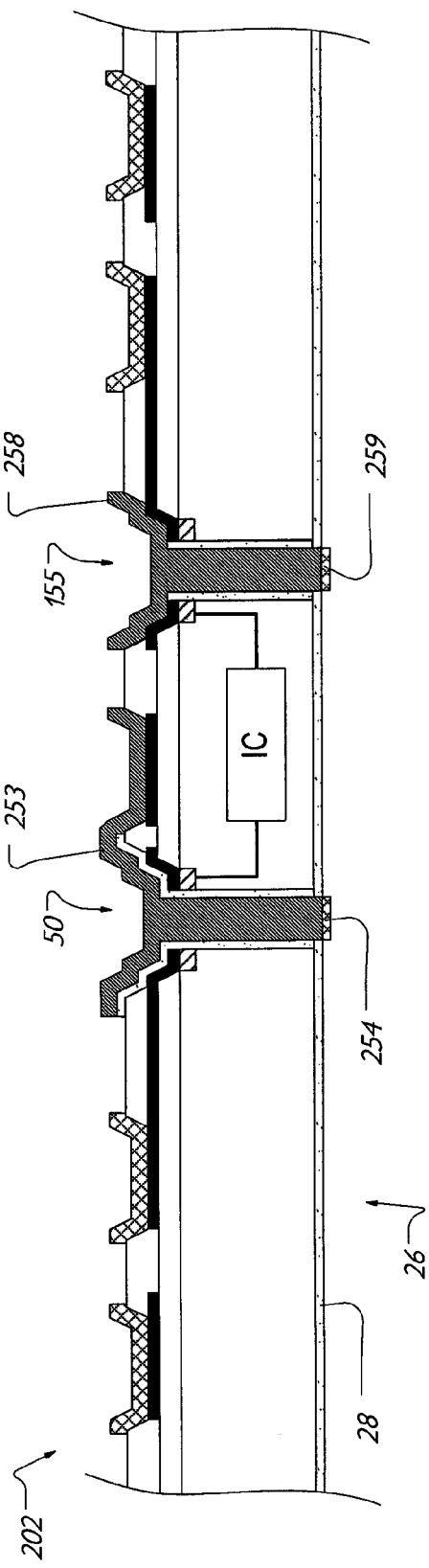

FIGS. 3I and 3J are cross-sectional side views of the workpiece 202 after forming the OLB pads 144a-d, a back-side contact 254 of the pass-through interconnect 50, and a back-side contact 259 of the conventional interconnect 155. FIG. 3I shows the OLB pads 144a-d electroplated (or electrolessly plated) onto exposed portions of the traces 142a-d and also shows the workpiece 202 thinned to expose portions of the metal layers 253 and 258 at the substrate back side 26. For example, a chemical etch, backgrinding, or chemical-mechanical polishing process may thin the substrate 22 as well as portions of the metal layers 253 and 258. Such a process may also remove portions of the dielectric layers 52 and 257 from the substrate back side 26. FIG. 3J shows the passivation layer 28 at the substrate back side 26 and the back side contacts 254 and 259 attached, respectively, to the metal layers 253 and 258. In many examples, the substrate 22 can be etched back prior to deposition of the passivation layer 28. In addition, the passivation layer 28 can be patterned at locations corresponding to the back side contacts 254 and 259. The back side contacts 254 and 259 can accordingly be formed at the patterned locations using a variety of metal deposition techniques, including electroplating and electroless plating.

FIG. 3K is a partially exploded, cross-sectional side view of the workpiece 202 during inter-die bonding and the die singulation stage. The second die 160 is aligned with and electrically connected to the workpiece 202 by forming the bump bonds 85 and 185 between, respectively, the second die OLB pads 84 and 184 and the back-side contacts 254 and 259. For example, the substrate back side 26 may include fiducials or other types of alignment markers for accurate alignment between the second die 160 and the interconnects 50 and 155. The second die 160 can also be optionally attached to the workpiece 202 with the adhesive layer 14 (FIG. 1A). After electrically connecting the second die 160 to the workpiece 202, the first die 120 can be singulated from the workpiece 202 via a die cutting process at substrate cutting lanes 236a and 236b, separating the assembly of the first and second dies 120 and 160 from the workpiece 202. The assembly of the first and second dies 120 and 160 can then be mounted and electrically coupled to a variety of substrates, such as the interposer substrate 90 (FIG. 1A). In other embodiments, this assembly can be coupled with other types of structures for carrying and/or electrically coupling with the first and second dies 120 and 160. For example, a back side of the second die 120 can be attached to a carrier substrate and the first die OLB pads 144a-d can be wirebonded to contact pads at the carrier substrate. Alternatively or additionally, the first and second dies 120 and 160 may also include other types of inter-die routings, in lieu of the bump bonds 85 and 185 and/or the second die redistribution layer 180. For example, in lieu of the bump bonds 80 and/or 185, various types of bonding techniques, such as copper-to-copper bonding, copper-to-tin bonding, oxide bonding, and electroplating may be used to electrically intercouple the pass-through and conventional interconnects 50 and 155 at the back side of the first die 120. Furthermore, embodiments of through-die interconnects may also be formed at other stages during the manufacture of a workpiece.

For example, FIG. 4 is a cross-sectional side view of a microelectronic die 320, including another embodiment of a through-die interconnect 350 that has been created prior to the formation of a redistribution layer 340 at the substrate 22. The interconnect 350 includes a metal layer 353 and an optional opening or void 351. The interconnect 350 is isolated from the substrate 22 and the substrate pad 30 by a dielectric layer 352. The redistribution layer 340 includes metal traces 342a and 342b, corresponding metal OLB pads 344a and 344b, and insulating layers 346 and 348. The trace 342b is connected to the integrated circuit 34 via the substrate pad 30, and the trace 342a is electrically isolated from the substrate pad 30 via the dielectric layer 352 and optionally by the insulating layers 346 and 348. Thus, the OLB pad 344b is electrically coupled to the integrated circuit 34, and the OLB pad 344a is electrically isolated from the integrated circuit 34.

FIGS. 5A and 5B illustrate stages of forming the interconnect 350. FIG. 5A is a cross-sectional side view of a microelectronic workpiece 402, including the substrate 22, the substrate pad 30, and a hole 423 formed in the substrate 22 and the substrate pad 30. The hole 423 is formed prior to the formation of the redistribution layer 340 (FIG. 4) and can also be formed during back-end of line (BEOL) wafer processing. FIG. 5B is a cross-sectional side view of the workpiece 402 after formation of the dielectric layer 352, the metal layer 353, and the insulating layer 346. The dielectric layer 352 is formed on top of the substrate pad 30 at a first contact surface 431a, electrically isolating the substrate pad 30 from the metal layer 353. The insulating layer 346 can include a patterned portion 349, exposing a second contact surface 431b of the substrate pad 30. The trace 342b (FIG. 4) can be attached to the second contact surface 431b, electrically coupling the trace 342b to the substrate pad 30 and ultimately the first integrated circuit 34. In many embodiments, the dielectric layer 352 and the metal layer 353 may be created using deposition, patterning, and plating processes similar to those described previously with reference to FIGS. 3E-3H, with the exception that these layers are formed prior to the formation of the insulating layer 346.

FIGS. 6A and 6B illustrate an embodiment of multiple 3D interconnects formed at a common substrate pad. FIG. 6A is a cross-sectional side view of a microelectronic die 520 including an integrated circuit 534, a first redistribution layer 540, a second redistribution layer 580, and first and second 3D interconnects 550a and 550b located at the substrate pad 30 and electrically intercoupling the first and second redistribution layers 540 and 580. The first 3D interconnect 550a electrically couples a metal trace 542a of the first redistribution layer 540 to a metal trace 582a of the second redistribution layer 580 and is electrically isolated from the substrate pad 30 and other traces by a dielectric layer 552a. Similarly, the second 3D interconnect 550b couples a metal trace 542b of the first redistribution layer 540 to a metal trace 582b of the second redistribution layer 580. However, the second 3D interconnect 550b is electrically coupled to the integrated circuit 534 via the substrate pad 30. For example, the interconnect 550b may concurrently communicate a signal to the integrated circuit 534 and to another integrated circuit (not shown) electrically coupled with the trace 582b. In many embodiments, the dielectric layers 552a and 552b and the interconnects 550a and 550b may be created using deposition, patterning, and plating processes similar to those described previously with reference to FIGS. 3E-3H, with the exception that the dielectric layers and metal layers are patterned to form two or more separate interconnects at the substrate pad 30. Also, in other embodiments, the first and/or second redistribution layers 540 and 580 could be omitted. For example, other types of electrical contacts could be coupled to the first and second interconnects 550a and 550b, including bump bonds and/or wirebonds. Furthermore, other embodiments may include more than two 3D interconnects extending through a common substrate pad 30.

FIG. 6B is a partial top-plan view of the die 520 showing the trace 542a coupling a metal OLB pad 544a to the interconnect 550a, the trace 542b coupling a metal OLB pad 544b to the interconnect 550b, and a metal trace 542c coupling a metal OLB pad 544c to the substrate pad 30. The dielectric layers 552a and 552b (drawn in phantom) electrically isolate the interconnects 550a and 550b from one another and from the substrate pad 30. Accordingly, in the example of FIG. 6B, the OLB pads 544a and 544b are in electrical communication with the second redistribution layer 580 (FIG. 6A), and the OLB pad 544c is in electrical communication with the integrated circuit 534 (FIG. 6A). In other embodiments, three or more through-die interconnects may be formed at the substrate pad 30, and dielectric layers similar to any of the above-described dielectric layers may be used to electrically isolate individual through-die interconnects from each other and from the substrate pad 30.

Figure 7:
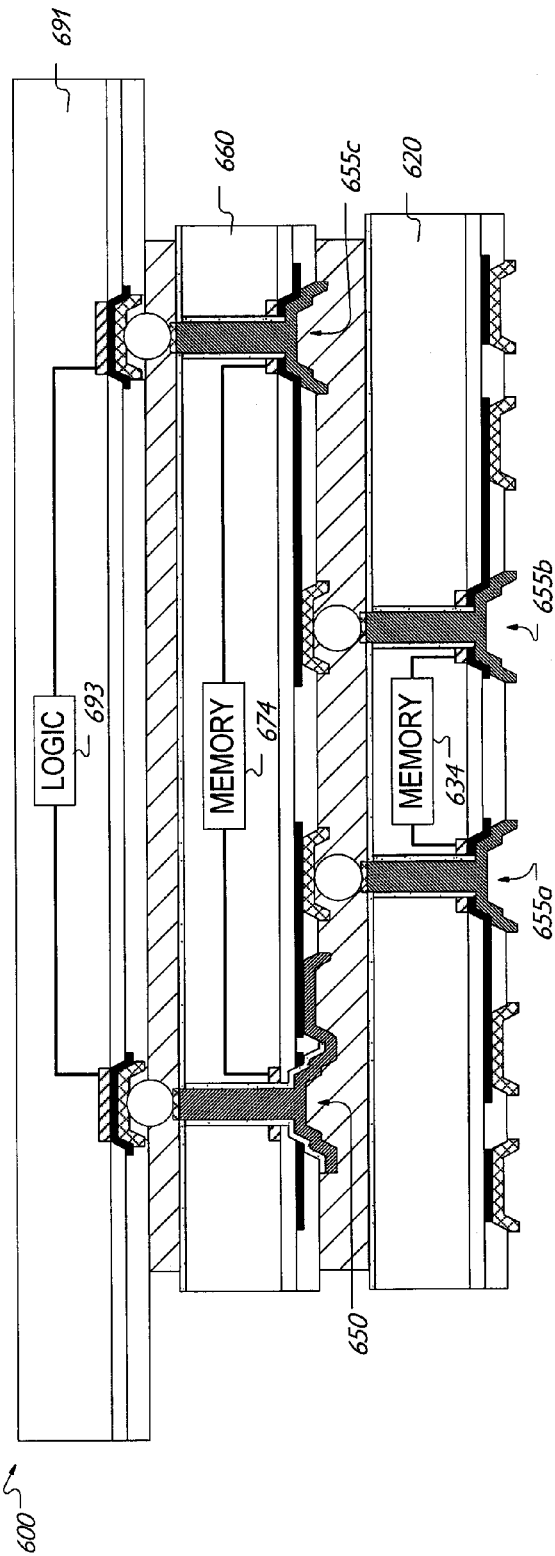
FIG. 7 is a cross-sectional side view of a stacked system of microelectronic dies including pass-through and conventional 3D interconnects configured in accordance with another embodiment of the disclosure.

Embodiments of pass-through 3D interconnects may be employed in a variety of systems, including systems having a single die (e.g., positioned between two interposer substrates)

or stacked systems of two or more levels of microelectronic dies. FIG. 7 is a cross-sectional side view of an embodiment of a memory system 600, including a stack of three microelectronic dies 620, 660, and 691. The first die 620 includes a first memory device 634 and first and second conventional 3D interconnects 655*a* and 655*b*. The second die 660 is attached to the first die 620 and includes a second memory device 674, a pass-through 3D interconnect 650, and a third conventional 3D interconnect 655*c*. The third die 691 is coupled to the second die 660 and includes a logic circuit 693. In the example of FIG. 7, the logic circuit 693 is electrically coupled with the first memory devices 634 via a communication path that includes the pass-through interconnect 650 and the first conventional interconnect 655*a*. The logic circuit 693 is also separately coupled to the second memory device 674 via a communication path that includes the second and third conventional interconnects 655*b* and 655*c*. In several embodiments, the second and third conventional interconnects 655*b* and 655*c* may be used to provide common bit- or word-line data to both of the first and second memory devices 634 and 674. The pass-through interconnect 650 and the first conventional interconnect 655*a*, on the other hand, may provide an independent signal to the first memory device 634 without also communicating this signal to the second memory device 674. For example, such an independent signal may include a chip select signal that enables reading to and/or writing from the first memory device 634. Alternatively, other independent signals can include clock signals or other types of signals that should not be communicated to the second memory device 674.

Figure 8:
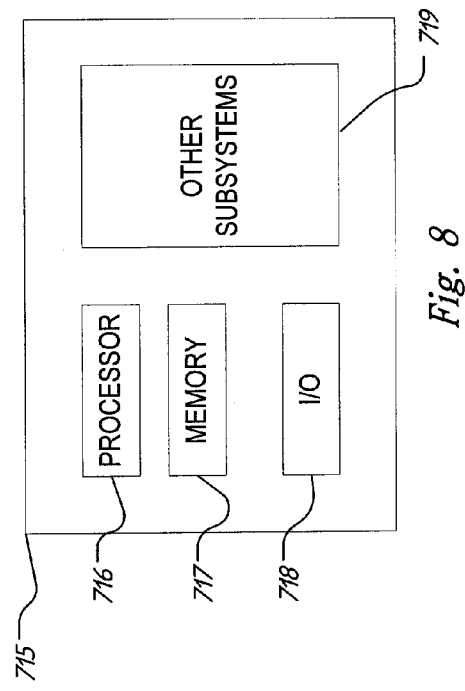
FIG. 8 is a schematic illustration of a system in which embodiments of pass-through 3D interconnects may be implemented.

Any one of the microelectronic devices described above with reference to FIGS. 1A-7 can be incorporated into any of a myriad of larger and/or more complex systems 715, a representative one of which is shown schematically in FIG. 8. The system 715 can include a processor 716, a memory 717 (e.g., SRAM, DRAM, Flash, and/or other memory device), input/output devices 718, and/or other subsystems or components 719. Microelectronic devices may be included in any of the components shown in FIG. 8. The resulting system 715 can perform any of a wide variety of computing, processing, storage, sensor, imaging, and/or other functions. Accordingly, representative systems 715 include, without limitation, computers and/or other data processors, for example, desktop computers, laptop computers, Internet appliances, hand-held devices (e.g., palm-top computers, wearable computers, cellular or mobile phones, personal digital assistants), multi-processor systems, processor-based or programmable consumer electronics, network computers, and minicomputers. Other representative systems 715 include cameras, light or other radiation sensors, servers and associated server subsystems, display devices, and/or memory devices. In such systems, individual dies can include imager arrays, such as CMOS imagers. Components of the system 715 may be housed in a single unit or distributed over multiple, interconnected units, e.g., through a communications network. Components can accordingly include local and/or remote memory storage devices and any of a wide variety of computer-readable media.

From the foregoing, it will be appreciated that specific embodiments of the invention have been described herein for purposes of illustration, but well-known structures and functions have not been shown or described in detail to avoid unnecessarily obscuring the description of the embodiments of the invention. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is inclusive and is used throughout to mean including at least the recited feature(s) such that any greater number of the same feature and/or additional types of other features are not precluded. It will also be appreciated that specific embodiments of the invention have been described herein for purposes of illustration, but that various modifications may be made without deviating from the invention. For example, many of the elements of one embodiment can be combined with other embodiments in addition to, or in lieu of, the elements of the other embodiments. Accordingly, the invention is not limited except as by the appended claims.

We claim:

1. A microelectronic workpiece, comprising:
   a substrate including a semiconductor circuit, a metal contact pad positioned at a front side of the substrate and electrically coupled to the semiconductor circuit, and a hole having a sidewall that extends at least partially through the substrate and the metal pad;
   a dielectric layer attached to a section of the sidewall of the hole that includes the metal pad and the substrate, the dielectric layer also extending over a front-side contact surface of the metal pad;
   a metal trace positioned between a portion of the dielectric layer and a portion of the front-side contact surface of the metal pad; and
   a metal layer attached to at least a portion of the dielectric layer adjacent the sidewall of the hole and the front-side contact surface of the metal pad, the metal layer being electrically isolated from the substrate pad and the metal trace via the dielectric layer.

2. The workpiece of claim 1 wherein the dielectric layer is attached to the front-side contact surface of the metal pad.

3. The workpiece of claim 1 wherein the substrate includes a back-side contact positioned at a back side of the substrate and electrically coupled with the metal layer.

4. The workpiece of claim 1 wherein the metal layer comprises a first metal layer, the sidewall of the hole comprises a first sidewall, the dielectric layer comprises a first dielectric layer, and the front-side contact surface of the metal pad comprises a first front-side contact surface, and wherein the workpiece further comprises:
   a second dielectric layer attached to a section of a second sidewall of the hole that includes the metal pad and the substrate; and
   a second metal layer attached to at least a portion of the second dielectric layer adjacent the second sidewall of the hole and the second front-side contact surface of the metal pad, the second metal layer being electrically isolated from the first metal layer via the second dielectric layer;
   wherein:
   a) the second metal layer is electrically isolated from the substrate pad via the second dielectric layer; or
   b) the second metal layer is electrically coupled to the semiconductor circuit via a second front-side contact surface of the metal pad.

5. The microelectronic workpiece of claim 1 wherein the substrate is a first substrate and the semiconductor circuit is a first semiconductor circuit, and wherein the microelectronic workpiece further comprises a second substrate coupled to a back-side of the first substrate, the second substrate including a second semiconductor circuit that is electrically coupled to the metal layer and electrically isolated from the first semiconductor circuit.

6. The microelectronic workpiece of claim 5, further comprising a metal bonding pad carried by the front-side of the first substrate and electrically coupled to the second semiconductor circuit via the metal layer, wherein the bonding pad is electrically isolated from the first semiconductor circuit.

7. The microelectronic workpiece of claim 5, further comprising a metal bonding pad carried by the first substrate, wherein the bonding pad is electrically coupled to the first semiconductor circuit and electrically isolated from the metal layer.

8. A system of stacked microelectronic dies, comprising:
   a first microelectronic die including a substrate having a front side and a back side, a metal substrate pad at the front side, and a first integrated circuit electrically coupled to the substrate pad;
   a pass-through 3D through-die interconnect that extends, at least, through the substrate between the front side and back side, the pass-through interconnect also extending through the substrate pad but being electrically isolated from the substrate pad, wherein the pass-through interconnect includes a dielectric layer positioned between the substrate pad and a metallic fill layer that electrically isolates the metallic fill layer from the substrate pad;
   a metal trace positioned between a portion of the substrate pad and the dielectric layer, wherein the metal trace is electrically connected to the substrate pad and the dielectric layer electrically insulates the metallic fill layer from the metal trace; and
   a second microelectronic die attached to the back side of the substrate and including a second integrated circuit electrically coupled to the pass-through interconnect at the back side of the substrate.

9. The system of claim 8 wherein the first die further includes a first metal bonding pad electrically coupled to the first integrated circuit via the substrate pad and a second metal bonding pad electrically coupled to the second integrated circuit via the pass-through interconnect.

10. The system of claim 8 wherein the metal trace is a first metal trace and the system further comprises a second metal trace, and wherein the first and second metal traces are routed to a common surface area associated with the substrate pad, the second trace is connected to the pass-through interconnect, and the dielectric layer electrically isolates the second trace from the substrate pad and/or the first trace.

11. The system of claim 8, further comprising an interposer substrate carrying the first and second dies, the interposer substrate including a first bond pad electrically coupled to the substrate pad and the first integrated circuit, and a second bond pad electrically coupled to the pass-through interconnect and the second integrated circuit.

12. The system of claim 8 wherein the first and/or second integrated circuits comprise at least one device selected from the group consisting of a processing device, a memory device, and an imager device, and wherein the pass-through interconnect is a component of an electrical communication path to the second integrated circuit that is electrically independent of the first integrated circuit.

13. The system of claim 8 wherein the pass-through interconnect is electrically isolated from the first integrated circuit.

\* \* \* \* \*